(12) United States Patent
Lubomirsky et al.

(10) Patent No.: US 12,181,801 B2
(45) Date of Patent: Dec. 31, 2024

(54) CHAMBER AND METHODS OF TREATING A SUBSTRATE AFTER EXPOSURE TO RADIATION

(71) Applicant: Applied Materials, Inc., Santa Clara, CA (US)

(72) Inventors: Dmitry Lubomirsky, Cupertino, CA (US); Douglas A. Buchberger, Jr., Livermore, CA (US); Qiwei Liang, Fremont, CA (US); Hyunjun Kim, Campbell, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 402 days.

(21) Appl. No.: 17/531,108

(22) Filed: Nov. 19, 2021

(65) Prior Publication Data

US 2022/0350251 A1  Nov. 3, 2022

Related U.S. Application Data

(60) Provisional application No. 63/183,598, filed on May 3, 2021.

(51) Int. Cl.
*G03F 7/38* (2006.01)
*H01J 37/32* (2006.01)

(52) U.S. Cl.
CPC .......... *G03F 7/38* (2013.01); *H01J 37/32082* (2013.01); *H01J 37/3244* (2013.01); *H01J 37/32522* (2013.01)

(58) Field of Classification Search
CPC ... G03F 7/38; H01J 37/32082; H01J 37/3244; H01J 37/32522
See application file for complete search history.

(56) References Cited

U.S. PATENT DOCUMENTS 4,317,844 A   3/1982   Carlson
4,960,488 A   10/1990  Law et al.
(Continued)

FOREIGN PATENT DOCUMENTS

JP   56-85827    7/1981
JP   01192118    8/1989
(Continued)

OTHER PUBLICATIONS

International Search Report and Written Opinion of the International Searching Authority mailed Jul. 2, 2004 for PCT/US01/002171.
(Continued)

*Primary Examiner* — Nicole M Ippolito
*Assistant Examiner* — Hanway Chang
(74) *Attorney, Agent, or Firm* — Patterson + Sheridan, LLP

(57) ABSTRACT

A method and apparatus for performing post-exposure bake operations is described herein. The apparatus includes a plate stack and enables formation of a first high ion density plasma before the ion concentration within the first high ion density plasma is reduced using a diffuser to form a second low ion density plasma. The second low ion density plasma is an electron cloud or a dark plasma. An electric field is formed between a substrate support and the diffuser and through the second low ion density plasma during post-exposure bake of a substrate disposed on the substrate support. The second low ion density plasma electrically couples the substrate support and the diffuser during application of the electric field. The plate stack is equipped with power supplies and insulators to enable the formation or modification of a plasma within three regions of a process chamber.

20 Claims, 9 Drawing Sheets

(56) References Cited

U.S. PATENT DOCUMENTS

| | | |
|---|---|---|
| 5,248,371 A | 9/1993 | Maher et al. |
| 5,262,610 A | 11/1993 | Huang et al. |
| 5,266,146 A | 11/1993 | Ohno et al. |
| 5,292,400 A | 3/1994 | Mumola |
| 5,401,350 A | 3/1995 | Patrick et al. |
| 5,464,499 A | 11/1995 | Moslehi et al. |
| 5,472,508 A | 12/1995 | Saxena |
| 5,531,834 A | 7/1996 | Ishizuka et al. |
| 5,753,886 A | 5/1998 | Iwamura et al. |
| 5,815,366 A | 9/1998 | Morita et al. |
| 5,882,414 A | 3/1999 | Fong et al. |
| 5,882,417 A | 3/1999 | van de Ven et al. |
| 5,882,424 A | 3/1999 | Taylor et al. |
| 5,935,340 A | 8/1999 | Xia et al. |
| 6,077,357 A | 6/2000 | Rossman et al. |
| 6,109,206 A | 8/2000 | Maydan et al. |
| 6,110,322 A | 8/2000 | Teoh et al. |
| 6,123,775 A | 9/2000 | Hao et al. |
| 6,125,859 A | 10/2000 | Kao et al. |
| 6,199,506 B1 | 3/2001 | Hilliker et al. |
| 6,305,390 B1 | 10/2001 | Jeon |
| 6,477,980 B1 | 11/2002 | White et al. |
| 6,495,054 B1 | 12/2002 | Eguchi et al. |
| 6,758,224 B2 | 7/2004 | Nogami |
| 6,998,014 B2 | 2/2006 | Chen et al. |
| 7,569,256 B2 | 8/2009 | Ichijo |
| 2001/0008138 A1 | 7/2001 | Demos et al. |
| 2002/0129902 A1 | 9/2002 | Babayan et al. |
| 2003/0143328 A1 | 7/2003 | Chen et al. |
| 2004/0134611 A1 | 7/2004 | Kato et al. |
| 2004/0144490 A1 | 7/2004 | Zhao et al. |
| 2005/0211170 A1 | 9/2005 | Hanawa et al. |
| 2010/0025371 A1 | 2/2010 | Cho et al. |
| 2014/0099795 A1 | 4/2014 | Tobin et al. |
| 2014/0158048 A1 | 6/2014 | Zhao et al. |
| 2015/0262869 A1* | 9/2015 | Naik ............... H01L 21/32139 438/643 |
| 2016/0032457 A1 | 2/2016 | Tanabe et al. |
| 2017/0069466 A1* | 3/2017 | Tran ............... H01L 21/67069 |
| 2020/0219757 A1 | 7/2020 | Breiling et al. |

FOREIGN PATENT DOCUMENTS

| | | |
|---|---|---|
| JP | 4-132219 | 5/1992 |
| JP | 06053176 | 2/1994 |
| JP | 09272979 | 10/1997 |
| JP | 10177993 | 6/1998 |
| JP | 10280151 | 10/1998 |
| JP | 2002075883 A | 3/2002 |
| JP | 2011-518408 A | 6/2011 |
| JP | 2014196561 A | 10/2014 |
| JP | 2018-533192 A | 11/2018 |
| JP | 2021507521 A | 2/2021 |
| KR | 20120103110 A | 9/2012 |

OTHER PUBLICATIONS

PCT International Preliminary Report on Patentability and Written Opinion of the International Searching Authority mailed Dec. 29, 2005 for PCT/US2004/017387.

PCT International Preliminary Report on Patentability mailed Aug. 11, 2005 for PCT/US2004/002171.

International Search Report and Written Opinion of the International Searching Authority mailed Jun. 17, 2022 for PCT/US2022/018523.

Japanese Office Action for Application No. 2023-567148 dated Aug. 27, 2024.

* cited by examiner

CHAMBER AND METHODS OF TREATING A SUBSTRATE AFTER EXPOSURE TO RADIATION

CROSS-REFERENCE TO RELATED APPLICATIONS

This application claims priority to U.S. Provisional Patent Application No. 63/183,598, filed May 3, 2021, the entirety of which is herein incorporated by reference.

BACKGROUND

Field

Embodiments of the present disclosure generally relate to methods and apparatus for semiconductor processing. More specifically, the disclosure is directed towards methods and apparatus for treating a substrate after exposure to radiation.

Description of the Related Art

Integrated circuits have evolved into complex devices that can include millions of components (e.g., transistors, capacitors and resistors) on a single chip. Photolithography is a process that may be used to form components on a chip. Generally, the process of photolithography involves several stages. Initially, a photoresist layer is formed on a substrate. A chemically amplified photoresist typically includes a resist resin and a photoacid generator. The photoacid generator, upon exposure to electromagnetic radiation in a subsequent exposure stage, alters the solubility of the photoresist in the development process. The electromagnetic radiation may be generated by any suitable source, for example, a laser, an electron beam, an ion beam, or other suitable electromagnetic radiation source. The electromagnetic radiation is also selected with any desirable wavelength, for example, 193 nm or other suitable wavelength.

In the exposure stage, a photomask or reticle is used to selectively expose certain regions of the substrate to electromagnetic radiation. Other exposure methods include maskless exposure methods or the like. Exposure to light decomposes the photo acid generator, which generates acid and results in a latent acid image in the resist resin. After exposure, the substrate is heated in a post-exposure bake process. During the post-exposure bake process, the acid generated by the photoacid generator reacts with the resist resin, changing the solubility of the resist during the subsequent development process.

After the post-exposure bake, the substrate, particularly the photoresist layer, is developed and rinsed to create a patterned mask. Depending on the type of photoresist used, regions of the substrate that were exposed to electromagnetic radiation are either resistant to removal or more prone to removal. After development and rinsing, the pattern of the mask is transferred to the substrate using a wet or dry etch process.

The evolution of chip design continually pursues faster circuitry and greater circuit density. The demand for greater circuit density typically utilizes a reduction in the dimensions of the integrated circuit components. As the dimensions of the integrated circuit components are reduced, more elements are able to be placed in a given area on a semiconductor integrated circuit. Accordingly, lithography processes transfer even smaller features onto a substrate, and lithography does so precisely, accurately, and without damage to meet advanced chip design specifications. In order to precisely and accurately transfer features onto a substrate, high resolution lithography utilizes a light source that provides radiation at small wavelengths. Small wavelengths help to reduce the minimum printable size on a substrate. However, small wavelength lithography suffers from problems, such as low throughput, increased line edge roughness, and/or decreased resist sensitivity.

Electrode assemblies are utilized to generate and deliver an electric field to a photoresist layer disposed on the substrate prior to or after an exposure process so as to modify chemical properties of a portion of the photoresist layer where the electromagnetic radiation is transmitted for improving lithography exposure/development resolution. However, there are difficulties in decreasing the printing size on the substrate using current photoresist materials and bake processes.

Therefore, there is a need for improved methods for resist patterning on a substrate.

SUMMARY

The present disclosure is generally relates to apparatus and methods for substrate processing. In one embodiment, an apparatus for substrate processing suitable for use in semiconductor manufacturing is described. The apparatus includes a face plate, a source match device electrically coupled to the face plate, and a diffuser disposed opposite the face plate. A plasma formation volume is disposed between the face plate and a first side of the diffuser. The apparatus further includes an insulator disposed between the face plate and the second diffuser. A process volume is partially formed by a second side of the diffuser and a substrate support is disposed within the process volume opposite the blocking screen. The substrate support includes one or more heating devices therein. A voltage source is in electrical communication with the diffuser and the substrate support and is configured to generate an electric field oriented vertically between the diffuser and the substrate support. The apparatus further includes a controller. The controller is configured to cause the apparatus to perform the operations of: flowing a process gas into the plasma formation volume; forming a first plasma with a first ion concentration; flowing the first plasma through the diffuser to form a second plasma with a second ion concentration of about $10^4$ ions/cm$^3$ to about $10^6$ ions/cm$^3$; applying a voltage differential between the diffuser and the substrate support to form an electric field across the second plasma, and heating a substrate with a resist layer disposed on the substrate support to a temperature of about 75° C. to about 300° C. while applying the electric field.

In another embodiment, a method for processing a substrate is described. The method includes flowing a process gas into a plasma formation region. A first plasma is formed with a first ion density from the process gas in the first plasma formation region. The first plasma is flowed through a diffuser and into a process region and forms a second plasma with a second ion density less than the first ion density. An electric field is applied across the second plasma within the process region between a substrate and the diffuser. A resist layer formed on the substrate is baked by heating the substrate using one or more heating devices while applying the electric field across the substrate.

In yet another embodiment, another method for processing a substrate is described. The method includes flowing an inert gas into a plasma formation region. A first plasma is formed with a first ion density from the inert gas in the first plasma formation region. The first plasma is flowed through an ion blocker plate and into a process region to form a second plasma with a second ion density of about $10^4$ ions/cm$^3$ to about $10^6$ ions/cm$^3$. An electric field is applied across the second plasma within the process region between a substrate support and the ion blocker plate. A resist layer formed on a substrate disposed on the substrate support is baked by heating the substrate using one or more heating devices while applying the electric field across the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
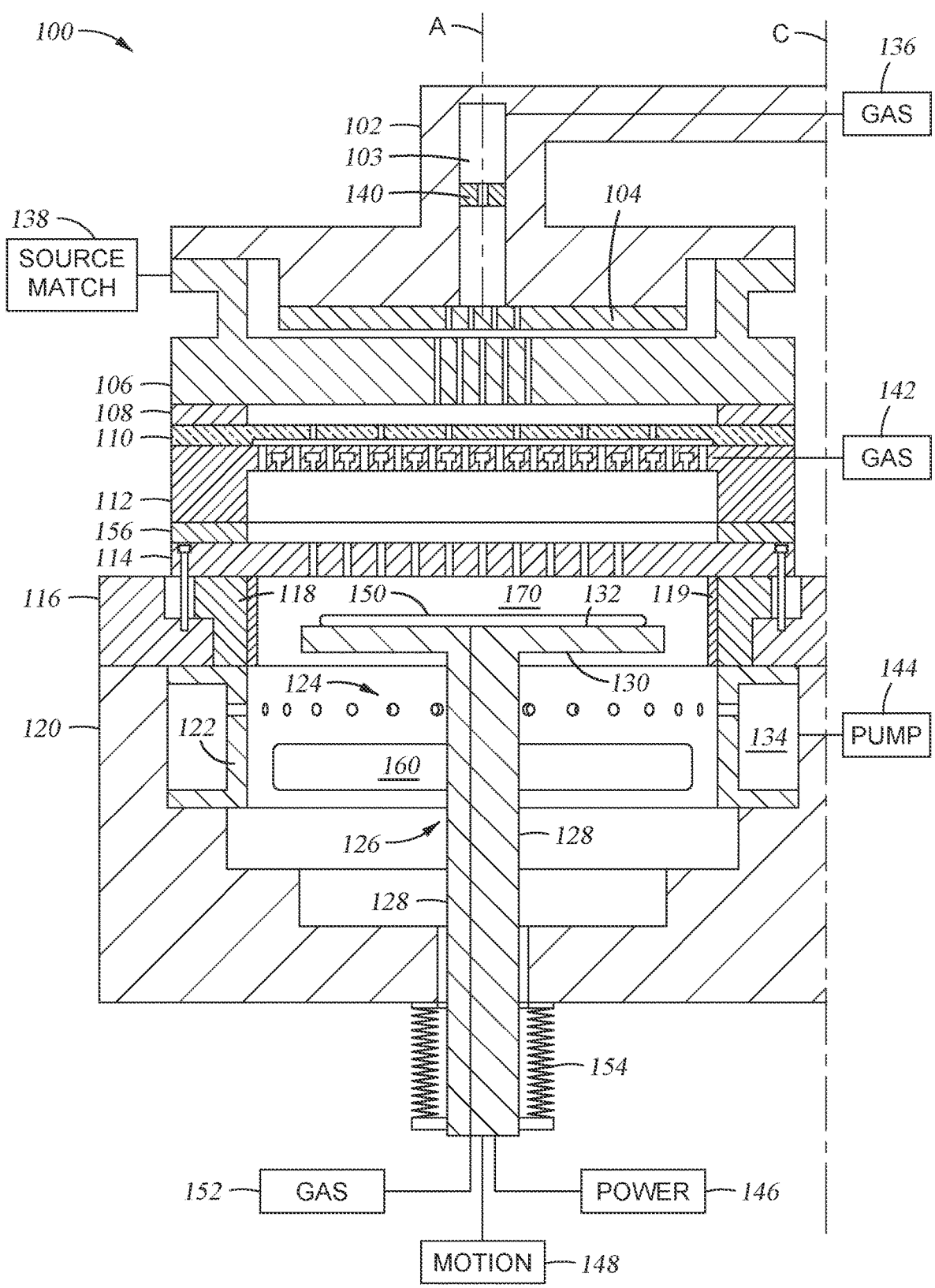
FIG. 1 illustrates a schematic cross-sectional view of a processing chamber, according to one embodiment.

The present disclosure is generally directed towards apparatus and methods for use during post-exposure bake of a semiconductor substrate. Methods and apparatus disclosed herein assist in reducing line edge/width roughness and improving exposure resolution in a photolithography process for semiconductor processing applications. Methods and apparatus disclosed herein may also assist in reducing the dose of radiation (eUV exposure) used to achieve similar critical dimensions compared to conventional techniques. The apparatus described herein enable an electric field guided bake of the resist layer on the substrate. The electric field guided bake may be performed before development of the substrate, such that a field guided bake is a post exposure field guided bake. Using a field guided bake on the photoresist layer has been shown to improve dose sensitivity and reduce line width roughness compared to conventional techniques.

A "substrate" or "substrate surface," as described herein, generally refers to any substrate surface upon which processing is performed. Processing includes deposition, etching, patterning and other methods utilized during semiconductor processing. A substrate or substrate surface which may be processed also includes dielectric materials such as silicon dioxide, silicon nitride, organosilicates, and carbon doped silicon oxide or nitride materials. In certain embodiments, the substrate or substrate surface includes photoresist materials, hardmask materials, or other films or layers utilized in the patterning of a substrate. The substrate itself is not limited to any particular size or shape. Although the embodiments described herein are made with generally made with reference to a round 200 mm or 300 mm substrate, other sizes and shapes, such as polygonal, squared, rectangular, curved, or otherwise non-circular workpieces may be utilized according to the embodiments described herein. Other substrate sizes may include 100 mm, 150 mm, 250 mm, 350 mm, 400 mm, 450 mm, etc.

The methods and apparatus disclosed herein improve the photoresist sensitivity and productivity of photolithography processes. The random diffusion of charged species generated by a photoacid generator during a post exposure bake procedure contributes to line edge/width roughness and reduced resist sensitivity. An electrode assembly, such as those described herein, is utilized to apply an electric field and/or a magnetic field to the photoresist layer during photolithography processes. The field application controls the diffusion of the charged species generated by the photoacid generator. Furthermore, an intermediate medium is utilized between the photoresist layer and the electrode assembly so as to enhance the electric field generated therebetween. In some embodiments, the intermediate medium is a fluid such as a liquid, a gas, or a plasma. In another embodiment, the intermediate medium is a non-liquid and non-solid medium.

An air gap defined between the photoresist layer and the electrode assembly results in voltage drop applied to the electrode assembly, thus, adversely lowering the electric field strength desired to be generated and applied to the photoresist layer. Inaccurate (e.g. too little or too much voltage and/or current) and/or non-uniform electric field strength at the photoresist layer may result in insufficient or inaccurate voltage power to drive or create charged species in the photoresist layer in certain desired directions, thus leading to diminished line edge profile control to the photoresist layer. Generating a controlled or desired electric field strength increases the accuracy and sensitivity of the photoresist layer to exposure and/or development processes.

In embodiments where the intermediate medium is a non-gas phase medium, such as a slurry, gel, liquid solution, or a solid state medium, voltage levels may be efficiently maintain as applied at a determined range when transmitting from the electrode assembly to the photoresist layer disposed on the substrate. However, using a non-gas phase (e.g. liquid or liquid-like material) as an intermediate medium has several challenges which are still to be resolved. For example, non-gas phase intermediate mediums have limited operation temperatures and may react with a resist layer disposed on the substrate.

Resistivity of non-gas phase fluids is also challenging to control in a stable range. In certain aspects and applications, the desired resistivity of intermediate mediums is about $6 \cdot 10^{10}$ Ohm·cm, but due to variations during semiconductor production, the actual resistivity is closer to $5 \cdot 10^{10}$ Ohm·cm. The resistivity and the temperature of the intermediate mediums change during substrate bake operations and are affected by oxygen content, impurities within the medium, and possible polymerization of the medium. The purity of the non-gas phase fluid is difficult to control and may cause defects on the substrate being processed. The non-gas phase fluid interacts differently with the photoresist at exposed regions when compared to unexposed regions and may cause photoresist loss and roughness changes.

Therefore, provided herein are solutions to the above problems that utilize a weakly ionized gas or a mixture of weakly ionized gases as the intermediate medium. The weakly ionized gas or gases are generated by flowing one or more gases into a plasma formation region and forming a high ion density plasma (about $10^5$ ions/cm$^3$ to about $10^{10}$ ions/cm$^3$). The high ion density plasma is later filtered and optionally combined with another gas to form a low ion density plasma ($10^4$ ions/cm$^3$ to $10^7$ ions/cm$^3$). The low ion density plasma mixture includes, but is not limited to, radicals and neutrons and is flowed through a showerhead to be delivered into the volume between the substrate and the opposing electrode. As the low ion density plasma passes through the showerhead and into the gap, the low ion density plasma mixture is filtered and exits the showerhead as a cloud of charged species. The low ion density plasma and the charged species cloud contains different kinds of ions and radicals from either the same gas or a mixture of gases. The charged species cloud includes a lower concentration of ions than the low ion density plasma, such as about $10^4$ ions/cm$^3$ to about $10^6$ ions/cm$^3$.

The electron density is defined as the number of free electrons in a volume. The electron density of each of the plasmas may be similar to the ion density, such that the electron density in the high ion density plasma is about $10^5$ electrons/cm$^3$ to about $10^{10}$ electrons/cm$^3$, the electron density in the low ion density plasma is about $10^4$ electrons/cm$^3$ to $10^7$ electrons/cm$^3$, and the electron density between the substrate and the electrode is about $10^4$ electrons/cm$^3$ to about $10^{10}$ electrons/cm$^3$. The electron and ion densities directly above the substrate are selected to form a plasma medium through which an electric field passes, while not treating or reacting with or remaining substantially inert to a resist layer on top of the substrate. The electric field is coupled through the plasma medium, such that the plasma medium is a charge carrying medium through which the electric field is more efficiently maintained. The gases utilized to form the plasma medium as well as the electron/ion densities within the plasma medium further influence if the plasma medium reacts with the resist layer on top of the substrate. Therefore, the shape, density, location, and makeup of the plasma medium are controlled to increase electric field coupling therethrough while reducing reaction with the substrate.

In some embodiments, only one of the high ion density plasma or the low ion density plasma are formed before passing through a showerhead or diffuser into the process volume between the substrate and an opposing electrode. In these embodiments, the ion density between the substrate and the opposing electrode is about $10^4$ ions/cm$^3$ to about $10^6$ ions/cm$^3$ and the electron density is about $10^4$ ions/cm$^3$ to about $10^6$ ions/cm$^3$.

The gases and plasmas within the process chamber are selected and/or controlled with respect to resistivity, temperature, pressure and composition. A pressure of the processing environment within the process chamber is between about 10 mTorr and about 800 Torr. A voltage is applied between the substrate and the opposing electrode, such that an electric field is formed through the gas or plasma phase medium between the substrate and the opposing electrode. The electric field is controlled by either applying a constant voltage or a constant current by a power supply to one or both of a substrate support or the electrode. The direction of the electric current may be monopolar or bi-directional, such that the electric field is oriented upwards or downwards relatively to the top surface of the substrate. In some embodiments, an alternating current is applied by the power supply.

The low ion density plasma/charged species cloud is delivered into a gap or volume between the substrate and opposing electrode. In embodiments described herein, the opposing electrode is a secondary plasma injection (SPI) showerhead. The SPI showerhead has a plurality of holes for the passage of gas therethrough.

In one embodiment, a bottom surface of the SPI showerhead facing the substrate is formed from a conductive material, such as a metallic or a semiconductor material with controlled resistivity. The top surface of the SPI showerhead faces away from the substrate and is coated by a dielectric layer to reduce or eliminate electrical current or the electric field from being oriented in an opposite direction (upwards) into other portions of a plate stack, such as another showerhead being maintained at ground potential.

In another embodiment, the SPI showerhead is formed from a dielectric material, such as a ceramic, quartz or plastic material. The bottom surface of the SPI showerhead is a metalized surface facing the substrate in this embodiment. Having the SPI showerhead formed from a dielectric material with a metalized surface is beneficial because the holes formed through the SPI showerhead have an inner surface fabricated from the dielectric material. When using the dielectric SPI showerhead with a metalized bottom surface, the voltage applied to the bottom metalized surface facing the substrate orients current and the electric field to flow through the low ion density plasma to the substrate or from the substrate and through the low ion density plasma.

In yet another embodiment, the SPI showerhead is formed from a silicon material, such as a crystalline silicon material, and the resistivity across the thickness of the SPI showerhead is controlled by doping the surface facing the substrate.

Another arrangement to prevent or reduce current or the electric field from being oriented in the upwards direction from the SPI showerhead includes increasing the resistance of the gap between the SPI showerhead and a grounded or floating showerhead above the SPI showerhead. In this embodiment, the gap is filled with a dielectric medium permeable to the low ion density plasma to enable the low ion density plasma to pass therethrough without complete recombination.

If a neutral or uncharged gas is desired to be added to the low ion density plasma, the neutral gas is added to the low density plasma by a dual channel showerhead located above the SPI showerhead. The dual channel showerhead includes at least one set of channels passing completely through the thickness of the showerhead body and a second set of channels with openings only on one side of the showerhead body and configured to provide one or more second gases/plasmas. A plasma generation source is placed on top of SPI showerhead and includes one or more of a capacitively coupled plasma (CCP) arrangement, an inductively coupled plasma (ICP) arrangement, an ultraviolet (UV) arrangement, a microwave arrangement, or a remote plasma source (RPS) arrangement. In some embodiments, a lower electrode of the CCP architecture is a showerhead or a diffuser, which serves as a plasma recombination member. Plasma recombination includes the removal of ions within the plasma to increase the ratio of radicals to ions. In embodiments where the diffuser is placed on the bottom of the CCP architecture, the plate stack may be equipped on preexisting chamber architectures.

In one embodiment, the plate stack described herein may be utilized on a SELECTRA® chamber available from Applied Materials, Inc, Santa Clara, CA It is contemplated that other suitably configured apparatus from other manufacturers may also benefit from the embodiments described herein. The diffuser may have a DC bias applied thereto relative to a substrate support. In this example, the diffuser is connected to DC power supply through an RF filter which enables an independent RF return path. The diffuser is electrically insulted from the chamber lid or body. The partially recombined or low ion density plasma flows into the process region in which the substrate is disposed and electric current/electric field flows between the substrate and the diffuser. In this embodiment, neither an SPI showerhead or a dual channel showerhead are utilized.

Within each of the embodiments described herein, while being exposed to the low ion density plasma, the substrate sits on a substrate support pedestal. The substrate support pedestal is positively or negatively charged with reference to the SPI showerhead. The substrate support pedestal includes vacuum chucking components and capabilities. The substrate support pedestal is a heated pedestal configured to control a temperature of the substrate.

FIG. 1 illustrates a schematic cross-sectional view of a process chamber 100, according to one embodiment. The process chamber 100 is configured to perform field guided post-exposure bake operations on a substrate with a photoresist or chemically modified resist layer disposed thereon. The process chamber 100 described herein may be mirrored across a centerline C, such that a second process chamber (not shown) form a unitary structure coupled to the same vacuum processing platform. In one embodiment, the platform is the PRODUCER® apparatus available from Applied Materials, Inc., Santa Clara, CA However, it is contemplated that other suitably configured apparatus available from other manufacturers may benefit from the embodiments described herein.

The process chamber 100 includes a mixing block 102, which serves as an RF electrode and/or a gas manifold. Process gasses are provided to the mixing block 102 from the gas source 136. The process gases from the gas source 136 enter the mixing block 102 through a feed-through member 103. In one embodiment, the feed-through member 103 is formed from a polymeric material, such as polytetrafluoroethylene. The mixing block 102 includes a flow centering insert 140 disposed therein. The flow centering insert 140 may be a ring like apparatus with an opening 204 formed therein. The opening 204 is formed through the center of the insert 140 and the opening 204 may be a single aperture or may be multiple apertures. The flow centering insert 140 improve concentric flow distribution of process gases within the plate stack of the process chamber 100. The flow centering insert 140 additionally assists in reducing backflow of plasma into the mixing block 102.

The mixing block 102 is electrically coupled to a first diffuser 104 and a face plate 106 that serve to redirect flow of the source gases so that gas flow is uniform (uniform from left to right in the view of FIG. 1). It should be noted that all of the diffusers or screens herein may be characterized as electrodes, as any such diffusers or screens may be coupled to a particular electrical potential. An insulator 108 electrically insulates the mixing block 102, including the face plate 106, from a second diffuser 110. The second diffuser 110 serves as a second electrode counterfacing the face plate 106. In one embodiment, the second diffuser 110 is a selectivity modulating device (SMD) and serves as an ion blocker plate. The first diffuser 104 and the face plate 106 are formed of a conductive material, such as a metal. The conductive material as described herein may be aluminum or an aluminum alloy. The insulator 108 is an insulation material, such as a dielectric. The insulation material may be a ceramic, such as aluminum oxide, or a quartz material.

Each of the first diffuser 104, the face plate 106, and the second diffuser 110 have a plurality of holes disposed therethrough to enable process gases to be flown through the plate stack (e.g. first diffuser 104, faceplate 106, insulator 108, second diffuser 110, gas distribution device 112, insulator plate 156, and blocking screen 114). At least a portion of the mixing block 102, the face plate 106, and the second diffuser 110 are formed of a conductive material, such as aluminum or an aluminum alloy.

Surfaces of the face plate 106, the second diffuser 110 and the insulator 108 define a first plasma generation region 210 where a first plasma is created when the gas from the gas source 136 is present and energy is provided at the face plate 106 through the mixing block 102.

Surfaces of the face plate 106 and the second diffuser 110 that face the first plasma generation region 210 directly may be coated with ceramic layers of, for example, yttria ($Y_2O_3$) or alumina ($Al_2O_3$) for protection from bombardment by energetic plasma products generated in the first plasma generation region 210. The ceramic coating may be formed by an electron beam coating process, an anodization process, and/or a non-pore anodization process. Other suitable coatings include nickel plating and surface oxidation processes, for example, by exposure to a concentrated $HNO_3$ solution. Other surfaces of the face plate 106 and the second diffuser 110 that are not necessarily exposed directly to plasma, but are exposed to reactive gases and/or radicals generated by plasmas, may be coated either with ceramic layers (e.g., yttria, alumina) or with a suitable passivating layer (e.g., an anodized layer, or a chemically generated alumina layer) for chemical resistance. The insulator 108 may be any insulator, and in certain embodiments, is formed from a ceramic material.

Plasma products generated in the first plasma generation region 210 pass through the second diffuser 110 that further promotes the uniform distribution of plasma products and assists in electron temperature control. Upon passing through the second diffuser 110, the plasma products pass through a gas distribution device 112. The gas distribution device 112 is also held at a similar voltage as the second diffuser 110 as the gas distribution device 112 and the second diffuser 110 contact one another at an edge. Apertures 216 (FIG. 2) that pass completely through the gas distribution device 112 are of a diameter at least three times a diameter of apertures within the second diffuser 110. The gas distribution device 112 includes a second and/or a third set of gas channels 214 that may be used to introduce one or more additional gases to the plasma products as they enter a second plasma generation region 218. The second and/or third set of gas channels 214 are coupled to a second gas source 142. The second gas source 142 is configured to supply one or more inert or neutral gases and may optionally assist in reducing the ionization of the plasma produced between the faceplate 106 and the second diffuser 110. The one or more additional gases emerge from a side of gas distribution device 112 distal to second diffuser 110. The gas distribution device 112 is made of aluminum or an aluminum alloy, and like the face plate 208 and the second diffuser 110 discussed above, may be coated with a passivating layer for chemical resistance, or may be coated with a ceramic layer.

Gases and plasmas flowed through the gas distribution device 112 enter the second plasma generation region 218 (FIG. 2) where the gases and plasmas mix. The second plasma generation region 218 is a plenum formed between the gas distribution device 112 and a blocking screen 114. Both the gas distribution device 112 and the blocking screen 114 may be held at different voltage potentials to control the ion density of the second plasma formed therebetween. In some embodiments, both the distribution device 112 and the blocking screen 114 are grounded, such that the second diffuser 110 and the gas distribution device 112 are connected to a first ground 253 while the blocking screen 114 is connected to a second ground 255. The gas distribution device 112 and the blocking screen 114 are separated by an insulator plate 156. The insulator plate 156 is formed from a ceramic or a plastic material and may be similar to the insulator 108. In one embodiment, the insulator plate 156 is formed of an aluminum oxide material. In other embodiments, the insulator plate 156 is formed of a plastic material, such as a fluorocarbon containing material. The plastic material may be polytetrafluoroethylene (PTFE) or polyether ether ketone (PEEK). The insulator plate 156 is selected to embody desirable electrical insulation properties, such that the resistivity of the insulator plate 156 is greater than about $10^{15}$ Ω·cm, such as greater than about $10^{16}$ Ω·cm, such as greater than about $10^{17}$ Ω·cm, such as greater than about $10^{18}$ Ω·cm. The insulator plate 156 enables control of the voltage differential between the gas distribution device 112 and the blocking screen 114. The blocking screen 114 is a plasma blocking screen or an ion blocking screen, such that the plasma is filtered as it passes through the blocking screen 114 and the concentration of ions is reduced. The blocking screen 114 may alternatively be described as a showerhead or a third diffuser plate.

Portions of the blocking screen 114 which are exposed directly to plasma may be coated with ceramic (e.g., alumina or yttria) while surfaces that are not exposed directly to plasma may also be coated with ceramic. Both the exposed and unexposed surfaces are advantageously coated with a passivating layer for chemical resistance to reactive gases and activated species.

Figure 2:
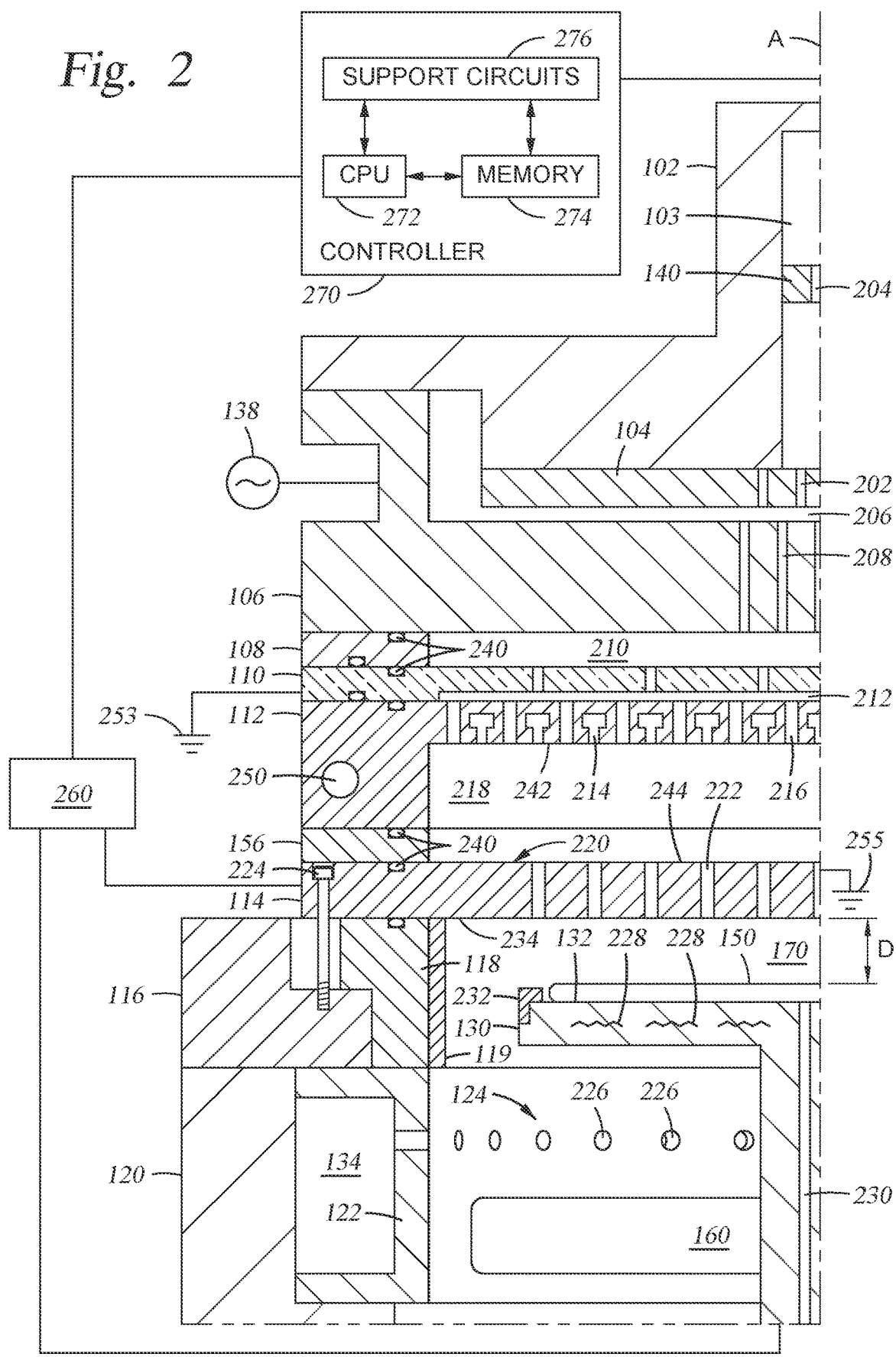
FIG. 2 illustrates a schematic cross-sectional view of a portion of the processing chamber of FIG. 1, according to one embodiment.

The blocking screen 114 constitutes the bottom plate of the plate stack as described in FIG. 1 and FIG. 2. The blocking screen 114 is a showerhead configured to prevent plasma from traveling back up the plate stack from the process volume 170. The blocking screen 114 is also configured to reduce the number of ions within a plasma passing through the blocking screen 114 and into the process volume 170. The bottom surface of the blocking screen 114 faces a process volume 170 and a top surface 132 of a substrate support 130.

The substrate support 130 is an upper portion of a substrate support assembly 126. The substrate support assembly 126 further includes a shaft 128 and bellows 154 connecting the substrate support assembly 126 to a lower chamber body 120. The bellows 154 form a seal between the process volume 170 and an outside environment. One or more backside gas sources 152 are coupled to the substrate support assembly 126 to supply backside gas to the top surface 132 of the substrate support 130. The backside gas sources 152 may also include a pump for forming a vacuum on the backside of the substrate 150.

A power source 146 and motion apparatus 148 are also coupled to the substrate support assembly 126. The power source 146 may be an AC or a DC power source. The power source 146 is configured to supply power to the motion apparatus 148 and/or one or more heating devices 228 (FIG. 2) within the substrate support 130. The motion apparatus 148 is configured to enable movement of the substrate support assembly 126, such as raising or lowering the substrate support assembly 126, rotating the substrate support assembly 126 about a central axis A, or tilting the substrate support assembly 126. The substrate support 130 is an aluminum substrate support 130.

The process chamber 100 further includes an upper chamber body 116 coupled to the lower chamber body 120. The upper chamber body 116 and the lower chamber body 120 are coupled together to define at least a portion of the process volume 170. The plate stack as described herein is disposed on top of the upper chamber body 116. The lower chamber body 120 includes at least one transfer passage 160 disposed therethrough. A pumping liner 122 is disposed radially inward of the lower chamber body 120. The pumping liner 122 includes a plurality of openings 124 disposed therethrough. The openings 124 connect an exhaust plenum 134 and the process volume 170, such that gas is removed via the exhaust plenum 134 by a pump 144. The openings 124 are disposed symmetrically about the pumping liner 122. A showerhead spacer 118 is disposed radially inward of the upper chamber body 116 and formed of a conductive material, such as an aluminum material. The showerhead spacer 118 further defines a portion of the process volume 170. An upper chamber liner 119 is disposed radially inward of the upper chamber body 116 and the showerhead spacer 118. The upper chamber liner 119 is an insulator. The upper chamber liner 119 is fabricated from a ceramic material. In some embodiments, the upper chamber liner 119 is fabricated from an aluminum oxide material or an aluminum nitride material.

A source match device 138, such as an RF matching circuit, is coupled to the plate stack, such that the source match device 138 is configured to be in electrical communication with the face plate 106. The source match device 138 is configured to apply an RF current or voltage to the face plate 106. The source match device 138 is configured to produce a plasma between the face plate 106 and the second diffuser 110.

FIG. 2 illustrates a schematic cross-sectional view of a portion of the processing chamber 100 of FIG. 1, according to one embodiment. FIG. 2 further illustrates the passages and plenums formed within the plate stack. As described herein an opening 204 is formed through the flow centering insert 140. Openings 202 are formed through the first diffuser 104 and in fluid communication with a first plenum 206. Openings 208 are formed through the face plate 106 and in fluid communication with the first plasma generation region 210.

The second diffuser 110 also includes a plurality of openings to enable process gases from the first plasma generation region 210 to flow through the second diffuser 110 and into a second plenum 212 formed between the second diffuser 110 and the gas distribution device 112.

The apertures 216 through the gas distribution device 112 are in fluid communication with both the second plenum 212 and the second plasma generation region 218. The gas distribution device 112 further includes one or more heaters 250 disposed therein to enable controlled heating of the gas distribution device. The one or more heaters may include resistive heating elements or an induction heater. The gas distribution device 112 and/or the second diffuser is electrically coupled to ground. Alternatively, one of the gas distribution device 112 or the second diffuser 110 is coupled to a power source to enable a voltage differential different from that applied to either of the faceplate 106 or the blocking screen 114.

An opening 220 is formed within the insulator plate 156 to form a portion of the second plasma generation region 218. The blocking screen 114 further includes a plurality of apertures 222 which fluidly couple the second plasma generation region 218 and the process volume 170. Due to the insulator plate 156, the blocking screen 114 and the gas distribution device 112 may be held at different electrical potentials to enable the plasma strength within the second plasma generation region 218 to be controlled. The apertures 222 through the blocking screen 114 are offset from the apertures through the second diffuser 110, such that a central axis running parallel to the direction of each of the apertures within the blocking screen 114 is offset from any central axis of an aperture formed through the second diffuser 110. Offsetting the apertures reduces the light exposure of the photoresist on the substrate 150 to a high ion density plasma formed within the first plasma generation region 210. The blocking screen 114 includes a top surface 244 and a bottom surface 234. The blocking screen 114 may be coupled to the upper chamber body 116 via one or more fasteners 224 disposed through the blocking screen 114.

The plurality of openings 124 of the pumping liner 122 may further include individual apertures 226 formed through the pumping liner 122. The individual apertures 226 circumscribe the pumping liner 122 to enable even removal of gases from the process volume 170 around the substrate support 130. In embodiments described herein, the one or more heating devices 228 disposed within the substrate support 130 are resistive heating devices. The backside gas sources 152 are fluidly coupled to the top surface 132 of the substrate support 130 via one or more gas conduits 230. An edge ring 232 may also be disposed on the edges of the substrate support 130 around the substrate 150.

A plurality of sealing rings 240 are disposed between each of the plates within the plate stack, such as between the face plate 106 and the insulator 108, between the insulator 108 and the second diffuser 110, between the second diffuser 110 and the gas distribution device 112, between the gas distribution device 112 and the insulator plate 156, and between the insulator plate 156 and the blocking screen 114. The sealing rings 240 are configured to seal the various regions 210, 218 and plenums 206, 212 to prevent the escape of plasma products from the chamber 100 and to enable vacuum integrity within the chamber 100.

As described above, a bottom surface 234 of the blocking screen 114 facing the substrate 150 is formed from a conductive material, such as a metallic or a semiconductor material with controlled resistivity. The top surface 244 of the blocking screen 114 faces away from the substrate 150 and is coated by a dielectric layer (not shown) to reduce or eliminate electrical current or the electric field from orienting in an opposite direction (upwards) into other portions of a plate stack, such as the gas distribution device 112.

In another embodiment, the blocking screen 114 is formed from a dielectric material, such as a ceramic, quartz or plastic material. The bottom surface 234 of the blocking screen 114 is a metalized surface facing the substrate 150 in this embodiment. Having the blocking screen 114 formed from a dielectric material with a metalized surface is beneficial in that the apertures 222 formed through the blocking screen 114 have an inner surface made from dielectric material. When using the dielectric blocking screen 114 with a metalized bottom surface, the voltage applied to the bottom metalized surface facing the substrate 150 orients current and the electric field through the low ion density plasma within the process volume to the substrate 150 or from the substrate 150 and through the low ion density plasma.

In yet another embodiment, the blocking screen 114 is formed from a silicon material, such as a crystalline silicon material, and the resistivity across the thickness of the blocking screen 114 is controlled by doping the surface facing the substrate.

In some embodiments, coating the surface of the blocking screen 114 in a dielectric material is performed on the entire surface of the blocking screen 114. Similarly, forming a metal coating over an entire ceramic blocking screen 114 may be possible. The distances between the blocking screen 114 and other chamber components would then otherwise be controlled to account for the change in electric field distribution within the plate stack.

A voltage supply 260 is connected between the blocking screen 114 and the substrate support 130. The voltage supply 260 enables control of the voltage differential between the blocking screen 114 and the substrate support 130. The voltage supply may be configured to create a voltage differential of about 0V to about 2000 V, such as about 10 V to about 2000 V. The voltage supply may further include AC/DC waveform control, such that a DC voltage may be applied or an AC voltage with a frequency of less than or equal to about 7.5 kHz, such as about 0 kHz to about 7.5 kHz. Controlling the voltage differential between the substrate support 130 and the blocking screen 114 enables the control of the electric field therebetween during baking of a resist disposed on the substrate 150. Either one of the blocking screen 114 or the substrate support 130 may be grounded. In the embodiment of FIG. 2, the blocking screen 114 is grounded and the substrate support 130 is either positively or negatively charged to form an electric field between the substrate support 130 and the blocking screen 114.

The above-described chamber 100 can be controlled by a processor based system controller such a controller 270. For example, the controller 270 may be configured to control flow of various precursor gases via the gas sources 136, 142, 152 and coordinate operation the source match 138 to facilitate plasma generation and flows within the chamber 100. The controller 270 may also be configured to control all aspects of electric field generation within the chamber 100 by modulating and controlling application of voltages to one or more of the components of the plate stack and the pedestal to generate an electric field within the process volume 170. The controller 270 further operates to control various stages of a substrate process sequence.

The controller 270 includes a programmable central processing unit (CPU) 272 that is operable with a memory 274 and a mass storage device, an input control unit, and a display unit (not shown), such as power supplies, clocks, cache, input/output (I/O) circuits, and the like, coupled to the various components of the chamber 100 to facilitate control of the substrate processing. The controller 270 also includes hardware for monitoring substrate processing through sensors in the chamber 100, including sensors monitoring flow, RF power, voltage potential and the like. Other sensors that measure system parameters such as substrate temperature, chamber atmosphere pressure and the like, may also provide information to the controller 270.

To facilitate control of the chamber 100 and associated plasma and electric field formation processes, the CPU 272 may be one of any form of general purpose computer processor that can be used in an industrial setting, such as a programmable logic controller (PLC), for controlling various chambers and sub-processors. The memory 274 is coupled to the CPU 272 and the memory 274 is non-transitory and may be one or more of readily available memory such as random access memory (RAM), read only memory (ROM), floppy disk drive, hard disk, or any other form of digital storage, local or remote. Support circuits 276 are coupled to the CPU 272 for supporting the processor in a conventional manner. The plasma and electric field formation and other processes are generally stored in the memory 274, typically as a software routine. The software routine may also be stored and/or executed by a second CPU (not shown) that is remotely located from the hardware being controlled by the CPU 272.

The memory 274 is in the form of computer-readable storage media that contains instructions, that when executed by the CPU 272, facilitates the operation of the chamber 100. The instructions in the memory 274 are in the form of a program product such as a program that implements the method of the present disclosure. The program code may conform to any one of a number of different programming languages. In one example, the disclosure may be implemented as a program product stored on computer-readable storage media for use with a computer system. The program (s) of the program product define functions of the embodiments (including the methods described herein).

In certain embodiments, the program(s) embody machine learning capabilities. Various data features include process parameters such as processing times, temperatures, pressures, voltages, polarities, powers, gas species, precursor flow rates, and the like. Relationships between the features are identified and defined to enable analysis by a machine learning algorithm to ingest data and adapt processes being performed by the chamber 100. The machine learning algorithms may employ supervised learning or unsupervised learning techniques. Examples of machine learning algorithms embodied by the program include, but are not limited to, linear regression, logistic regression, decision tree, state vector machine, neural network, naïve Bayes, k-nearest neighbors, K-Means, random forest, dimensionality reduction algorithms, and gradient boosting algorithms, among others. In one example, the machine learning algorithm is utilized to modulate RF power and precursor gas flow to form a plasma and then facilitate maintenance of a low ion density plasma which includes a greater concentration of radicals than ions. The formation of charges species in this manner may be refined and improved by identifying constituents of the charged species cloud (e.g. radicals and/or ions) and modifying chamber process or apparatus characteristics to form and maintain a charged species cloud which exhibits desirable characteristics as an electric field coupling medium between an electrode (e.g. screen 114) and the pedestal 130.

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

The distance between the perforated bottom surface 242 of the gas distribution device 112 and the top surface 244 of the blocking screen 114 is less than about 20 mm, such as less than about 20 mm, such as about 5 mm to about 18 mm, such as about 10 mm to about 18 mm, such as about 12 mm to about 17 mm. The distance D between the bottom surface 234 of the blocking screen 114 and the substrate support surface 132 is about 2 mm to about 60 mm, such as about 5 mm to about 56 mm, such as about 16 mm to about 56 mm, such as about 32 mm to about 56 mm. The gaps between the gas distribution device 112, the blocking screen 114, and the substrate support surface 132 are small enough to enable good electric field uniformity while large enough to prevent breakdown and discharge of the gases within the second plasma generation region 218 and the process volume 170, respectively. The distance D between the blocking screen 114 and the substrate support surface 132 is configured to enable control of the plasma formed in the process volume 170 while reducing the interaction of the plasma with the substrate 150. The plasma is controlled to provide a uniform and uni-directional electric field passing therethrough to interact with the substrate 150. The plasma within the process volume 170 acts to electrically couple the substrate 150 and the blocking screen 114 and enables better control of the electric field through the process volume 170.

Figure 3:
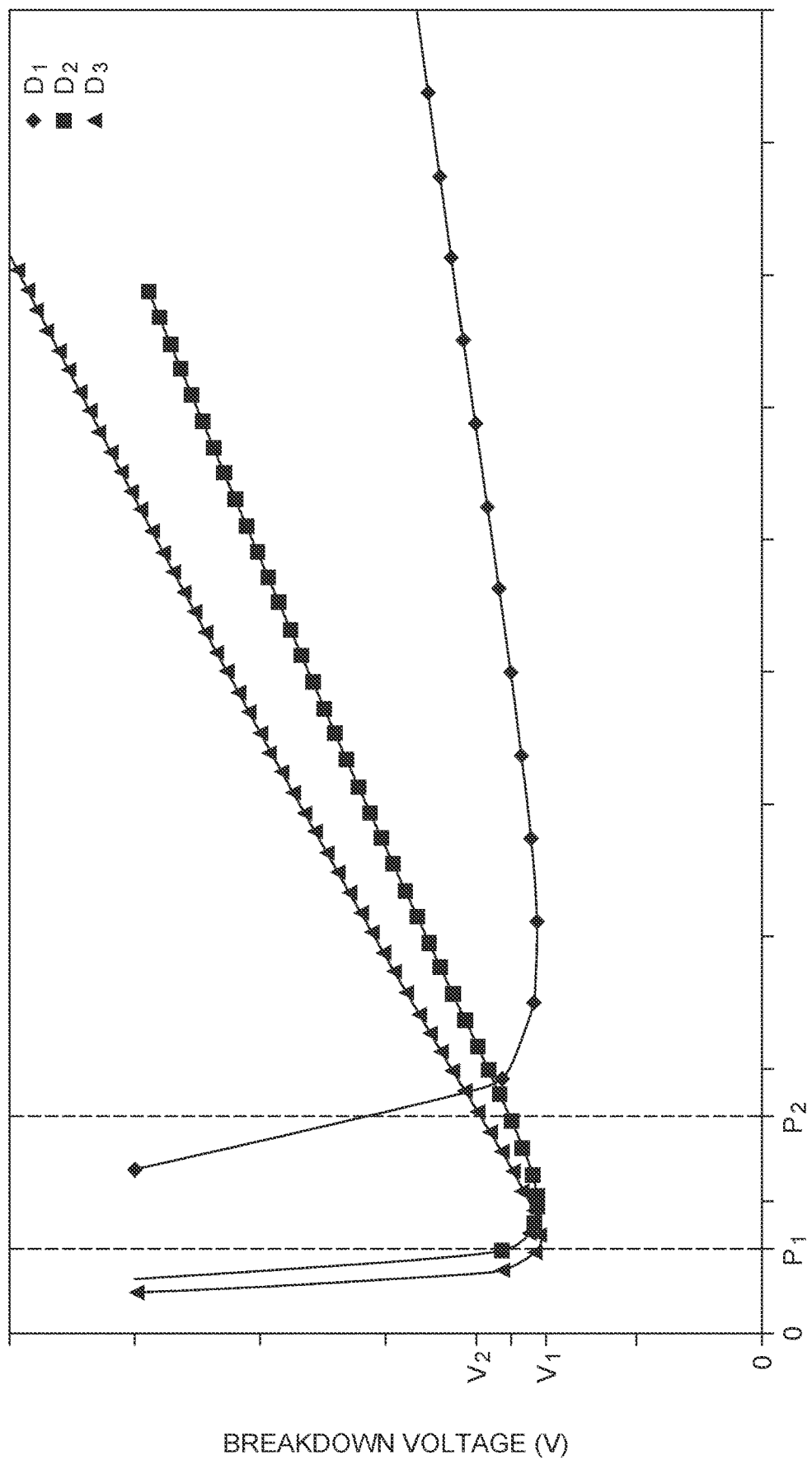
FIG. 3 illustrates a graph of breakdown voltages using different pressures and electrode separation distances, according to one embodiment.

FIG. 3 illustrates a graph of breakdown voltages using different pressures and electrode separation distances, according to one embodiment. The graph of FIG. 3 illustrates breakdown voltage values for three different distances between electrodes at different pressures. The three distances measured are labeled as $D_1$, $D_2$, and $D_3$. $D_1$ may be a distance of less than about 5 mm, $D_2$ is a distance of less than about 15 mm, and $D_3$ is a distance of greater than 15 mm. The gas pressure between the two electrodes is kept at a pressure, such as one of a first pressure $P_1$ or a second pressure $P_2$. The first pressure $P_1$ is about 0.5 Torr to about 2 Torr and the second pressure $P_2$ is about 2 Torr to about 5 Torr. While between the first pressure $P_1$ and the second pressure $P_2$, the voltage differential applied between the two electrodes is kept between a first voltage $V_1$ and a second voltage $V_2$ to prevent gas breakdown, wherein the first voltage $V_1$ is lower than the second voltage $V_2$. The first voltage $V_1$ is about 150 V to about 200 V. The second voltage $V_2$ is about 200 V to about 250 V. Therefore, FIG. 3 assists in determining the maximum voltage which can be applied to one or more gases at certain pressures and distances between the electrodes before breakdown of the one or more gases.

Figure 4A:
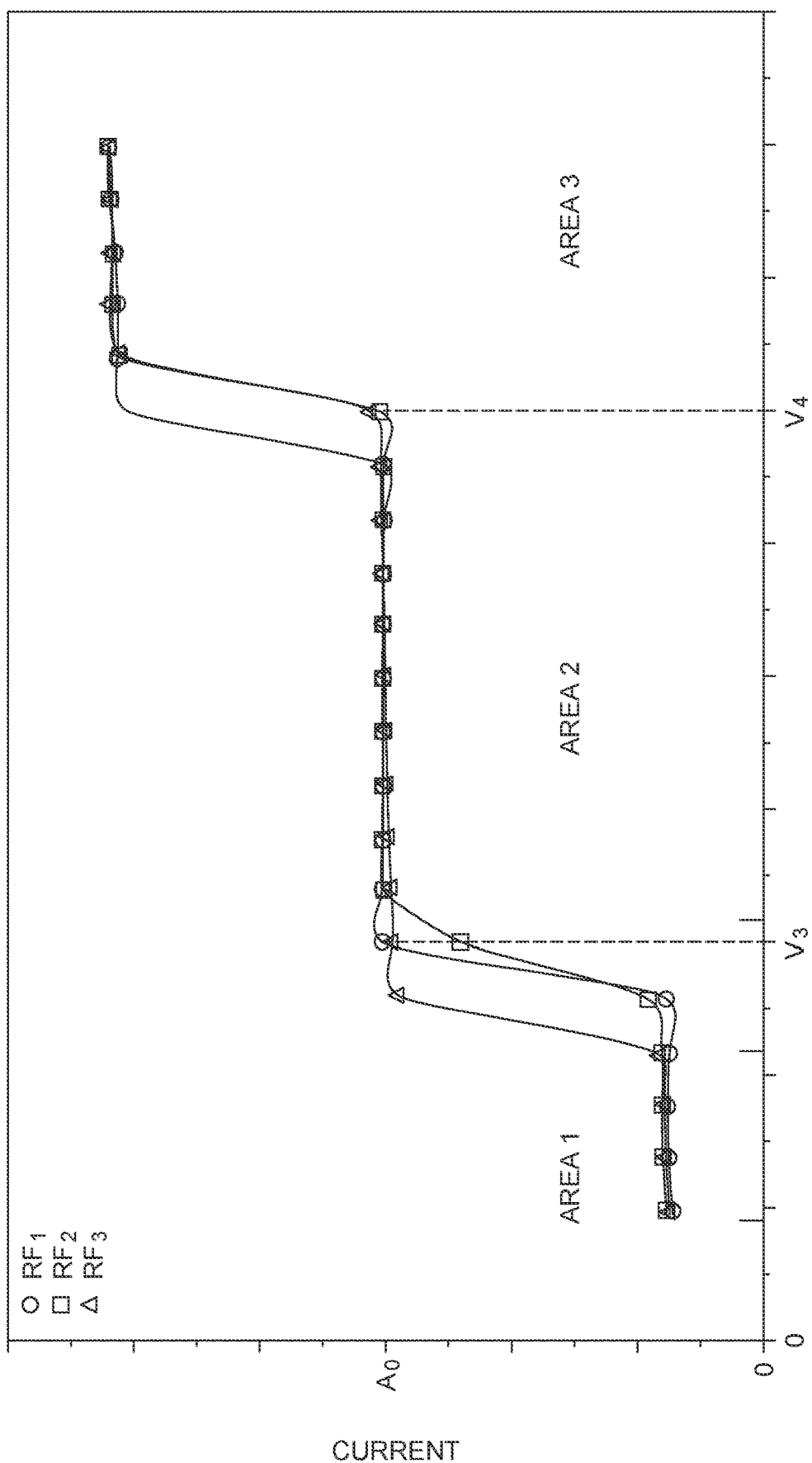
FIG. 4A illustrates a graph of current flowing between electrodes at varying DC voltage differentials between the electrodes, according to one embodiment.
Figure 4B:
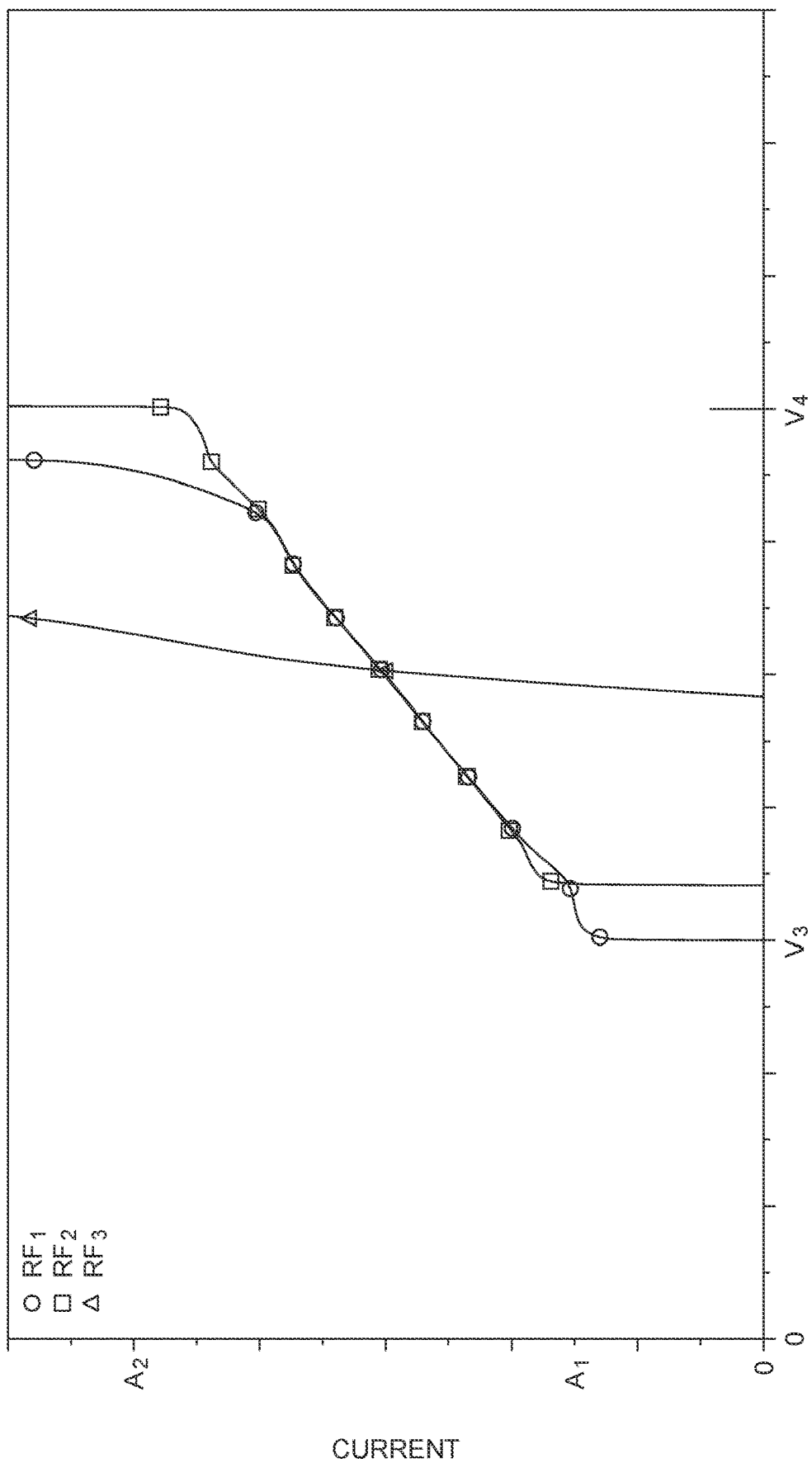
FIG. 4B illustrates a graph of current flowing between electrodes at varying DC voltage differentials between the electrodes, according to another embodiment.

FIGS. 4A and 4B illustrate graphs of the current flowing between electrodes when at varying DC voltage differentials between the electrodes. FIGS. 4A and 4B utilized electrodes within a helium environment at 1 Torr and a gap distance of 12.7 mm to measure current arc between the parallel electrodes. FIG. 4B is a close up view of the DV voltage range between a third voltage $V_3$ and a fourth voltage $V_4$. As shown in FIG. 4A, a neutral current $A_0$ is a current of about zero and therefore little to no arcing is occurring between adjacent electrodes. Different RF power values have a similar current arc path, such as at a first RF power value $RF_1$, a second RF power value $RF_2$, or a third RF power value $RF_3$. The first RF power value $RF_1$ is about 100 W to about 300 W. The second RF power value $RF_2$ is about 350 W to about 750 W. The third RF power value $RF_3$ is about 750 W to about 1250 W.

As shown in FIG. 4B, while between the third voltage $V_3$ and the fourth voltage $V_4$, the arc current between the two electrodes takes on a generally linear response. The arc current is kept between a first current value $A_1$ and a second current value $A_2$. The first current value $A_1$ is greater than about $-0.025$ mA, such as greater than about $-0.02$ mA. The second current value $A_2$ is less than about 0.025 mA, such as less than about 0.02 mA. The third voltage $V_3$ and the fourth voltage $V_4$ values, which keep the arc current between the first current value $A_1$ and the second current value $A_2$, are a third voltage $V_3$ of about $-250$ V to about $-150$ V and a fourth voltage $V_4$ of about 150 V and about 250 V. During field guided post exposure bake operations, keeping the arc current close to zero, such as between the first current value $A_1$ and the second current value $A_2$, improves process results as arcing may damage the substrate or cause non-uniformities during substrate processing.

Figure 5:
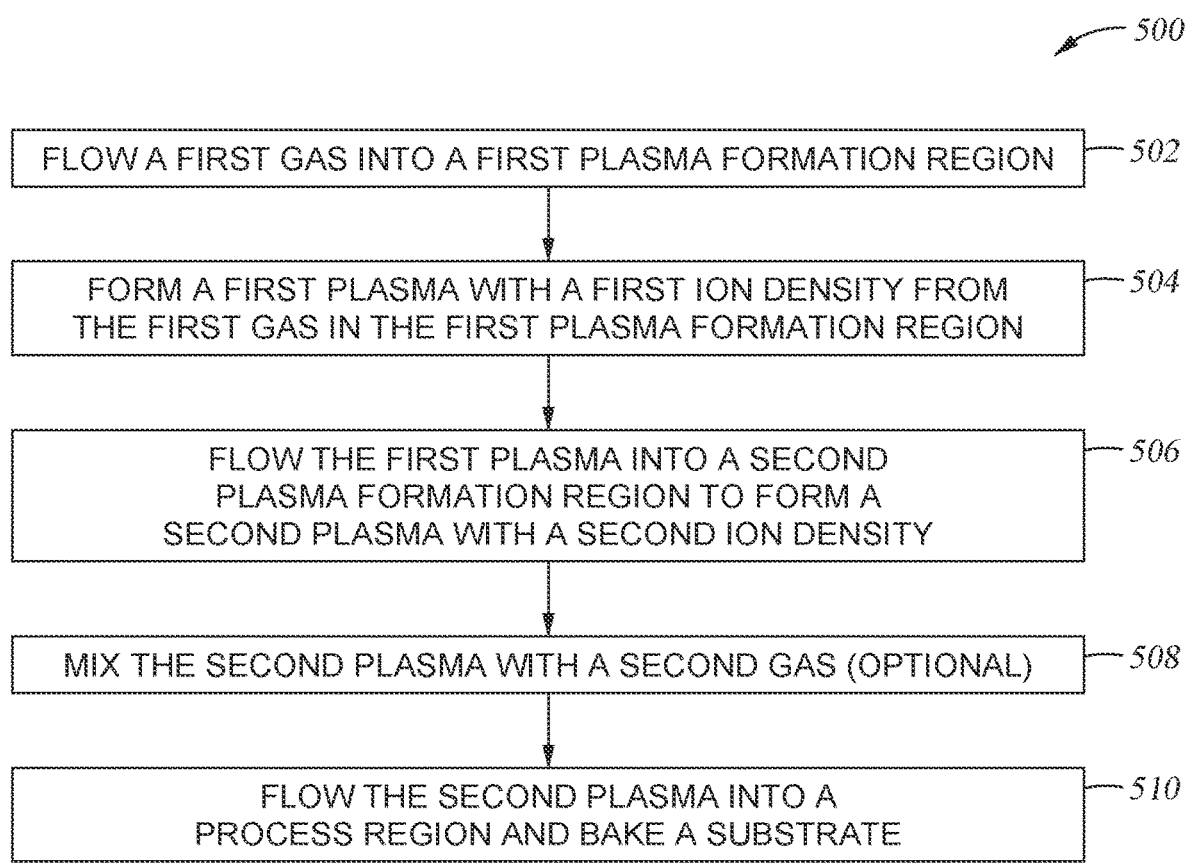
FIG. 5 is a flow diagram of a method of processing a substrate within the processing chamber of FIG. 1, according to one embodiment.

FIG. 5 is a flow diagram of a method 500 of processing a substrate within the processing chamber of FIG. 1, according to one embodiment. The method 500 includes flowing a first gas into a first plasma formation region, such as the first plasma generation region 210, during an operation 502. After flowing the first gas into the first plasma formation region, a first plasma is formed within the first plasma generation region 210 during another operation 504. The first plasma has a first ion density. The first ion density plasma is a high ion density plasma, such that the ion density within the first plasma is about $10^5$ ions/cm$^3$ to about $10^{10}$ ions/cm$^3$. Similarly, the first electron density is about $10^5$ electrons/cm$^3$ to about $10^{10}$ electrons/cm$^3$. Within the first plasma generation region 210, an AC voltage applied between the face plate 106 and the second diffuser 110 with a frequency of about 8 MHz to about 20 MHz, such as about 10 MHz to about 15 MHz. The first gas flowed into the plasma formation region is an inert gas or a mixture of inert gases, such as helium, neon, argon, krypton, and/or xenon. In some embodiments, the first gas is one or a mixture of helium and argon. In embodiments described herein, the first gas flowed into the first plasma formation region 210 consists of only inert or other non-reactive gases, such that the process gas comprises only one or more inert gases. If other gases, such as deposition precursors, cleaning gases, or oxidation precursors are utilized the resist material disposed on the substrate may be damaged or contaminated. The first gas is held at a pressure of about 0.5 Torr to about 8 Torr, such as about 1 Torr to about 5 Torr. The power applied to the first gas while within the first plasma generation region 210 is about 25 W to about 2000 W, such as about 50 W to about 1500 W. During the operation 504, the face plate 106 is attached to a power source, such that the RF power is applied to the face plate 106, while the second diffuser 110 is electrically grounded and has a constant voltage potential.

The first plasma is then flowed through the second diffuser 110 and into the second plenum before being flowed through the apertures 222 of the gas distribution device 112. The first plasma is flowed into the second plasma generation region 218 from the first plasma generation region 210 during another operation 506. During operation 506, the ions within the first plasma are reduced by the gas distribution device 112 to form the second plasma. The second plasma may optionally be mixed with a second gas during another operation 508. During the operation 508, the second gas is introduced to the second plasma generation region 218 (mixing region), and mixed with the second plasma. The second plasma has a second ion density lower than the first ion density of the first plasma. The second plasma is described as a low ion density plasma and has an ion concentration of about $10^3$ ions/cm$^3$ to about $10^7$ ions/cm$^3$. Similarly, the second electron density is about $10^3$ electrons/cm$^3$ to about $10^7$ electrons/cm$^3$. The grounding of the gas distribution device 112 and the blocking screen 114 being electrically connected to the voltage source 260 enables the energy level and concentration of ions within the second plasma to be controlled within the second plasma generation region 218. As the first plasma passes through the gas distribution device 112, ions are removed to decrease the energy level within the second plasma. The gas distribution device 112 is heated to a temperature between about 120° C. to about 250° C.

After the formation of the second plasma, the second plasma is flowed through the apertures 222 of the blocking screen 114 and into the process volume 170 between blocking screen 114 and the substrate support 130/substrate 150. The plasma within the process volume 170 is a third plasma. The voltage differential between the blocking screen 114 and the substrate support 130 is about 0V to about 300 V, such as about 10 V to about 250 V. The voltage source 260 may further include AC/DC waveform control, such that a DC voltage may be applied or an AC voltage with a frequency of less than or equal to about 7.5 kHz, such as an AC voltage of about 0 kHz to about 7.5 kHz. In some embodiments, the AC waveform may have a DC offset, such that the signal peaks are not centered about 0 V. The pressure within the process volume 170 is about 0.5 Torr to about 10 Torr, such as about 0.5 Torr to about 8 Torr, such as about 1 Torr to about 5 Torr.

The third plasma is described as a charged species cloud while within the process volume 170, such that the concentration of ions within the third plasma is reduced while passing through the blocking screen 114 and into the process volume 170. The ions/electrons within the charged species cloud are controlled by the electric field formed between the blocking screen 114 and the substrate support 130. The electric field assists in controlling the ion density and ion energy levels within the second plasma, such that the ion or electron density is about $10^4$ ions/cm$^3$ to about $10^6$ ions/cm$^3$. Similarly, the electron density within the third plasma is about $10^4$ electrons/cm$^3$ to about $10^6$ electrons/cm$^3$. The charged ions within the charges species cloud have an ion temperature of less than about 1 eV each and therefore have reduced impact on the photoresist disposed on the substrate 150. The low power third plasma/charged species cloud may be referred to herein as a dark plasma above the substrate support 130. The dark plasma is beneficial in that the photoresist does not undergo a concurrent exposure process during the post exposure bake operation which utilizes the dark plasma.

Either concurrently with or immediately after the second plasma is flowed into the process volume 170 to form the charged species cloud, the substrate on the substrate support surface 132 is baked at a temperature of about 75° C. to about 300° C., such as about 100° C. to about 250° C. during another operation 510. While the substrate is baked during the operation 510, an electric field is applied between the substrate support 130 and the blocking screen 114 and through the third plasma. The third plasma serves to couple the electric field and enables improved control of the electric field strength and subsequent resist bake operations on the substrate. The substrate as described herein includes a resist layer, such as a photoresist layer disposed thereon. The application of heat and the electric field to the substrate is performed after the resist layer has been patterned during an exposure operation, wherein the resist layer was exposed to a radiation source to form exposed and unexposed portions of the resist layer. The heat and electric field application bake the resist layer and drive charged particles within the resist layer in pre-determined directions to reduce the diffusion of the charged particles in undesired directions.

The generated electric field is coupled to the substrate through the charged species cloud. The charged species cloud additionally conducts a small amount of current (about 0.005 mA to about 0.1 mA, such as about 0.005 mA to about 0.05 mA) between the substrate 150/substrate support surface 132 and the blocking screen 114. The small amount of current has been found to improve bake results while not negatively impacting the resist layer.

Figure 6:
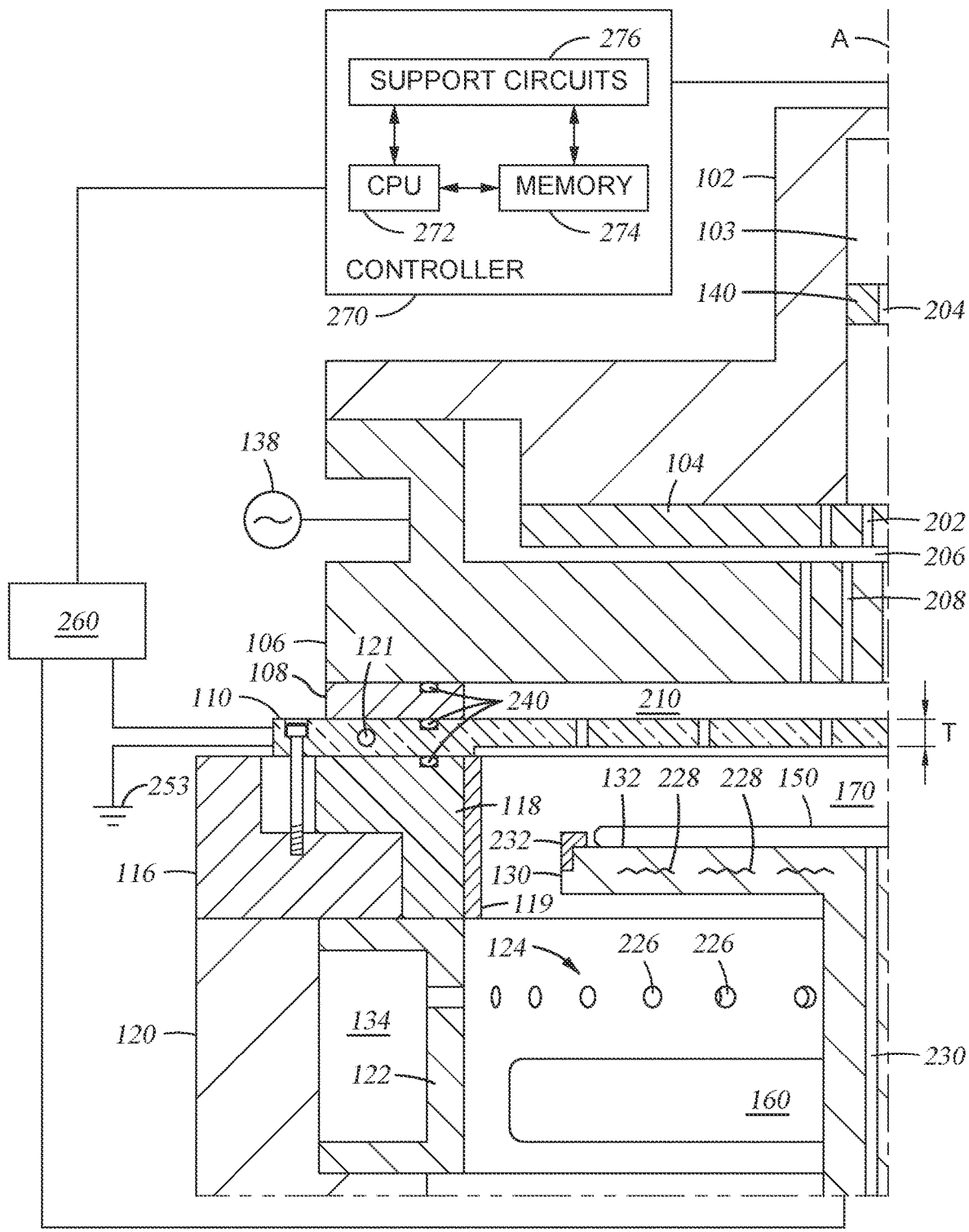
FIG. 6 illustrates a schematic cross-sectional view of a portion of the processing chamber of FIG. 1, according to another embodiment.

FIG. 6 illustrates a schematic cross-sectional view of a portion of the processing chamber 100 of FIG. 1, according to another embodiment. The processing chamber 100 of FIG. 6 is similar to the processing chamber 100 of FIG. 2, but the gas distribution device 112, the insulator plate 156, and the blocking screen 114 are removed. The second diffuser 110 therefore rests directly on the showerhead spacer 118 and/or the upper chamber body 116 without any additional diffusion plates or showerheads disposed between the second diffuser 110 and the substrate support 130. In this embodiment, the second diffuser 110 is electrically coupled to the voltage source 260 and may have a power or voltage applied thereto. The second diffuser 110 may also be grounded by a ground 253. The ground 253 may be used to hold the second diffuser 110 as a base voltage value, while the voltage source 260 applies a voltage to the second diffuser 110. The substrate support 130 is powered or has a voltage differential applied thereto by the voltage source 260. In this embodiment, a first plasma is formed in the first plasma generation region 210, but the amount of ions are reduced through the second diffuser 110 to form the charged species cloud as previously described herein.

The thickness T and the aperture arrangment of the second diffuser 110 are configured to assist in modulating the number of ions/electrons which pass through the second diffuser 110. In embodiments described herein, the thickness T is the thickness of the central portion of the second diffuser 110 where apertures/passages are formed. The thickness T is about 5 mm to about 40 mm, such as about 5 mm to about 10 mm, such as about 5 mm to about 8 mm, such as about 5 mm to about 7 mm. In some embodiments, the thickness T of the second diffuser 110 is greater than about 6 mm, such as greater than about 8 mm, such as greater than about 10 mm, such as greater than about 12 mm. In embodiments wherein the thickness T is greater than about 10 mm, the width of each of the apertures may change part way through the second diffuser 110, such that the apertures narrow as the apertures approach the bottom surface of the second diffuser 110 which faces the substrate support 130. The apertures are sized to enable a reduction in the number of ions passing through the second diffuser.

As described above, a bottom surface of the second diffuser 110 facing the substrate 150 is formed from a conductive material, such as a metallic or a semiconductor material with controlled resistivity. The top surface of the second diffuser 110 faces away from the substrate 150 and is coated by a dielectric layer (not shown) to reduce or eliminate electrical current or the electric field from orienting in an opposite direction (upwards) into other portions of a plate stack.

In another embodiment, the second diffuser 110 is formed from a dielectric material, such as a ceramic, quartz or plastic material. The bottom surface of the second diffuser 110 is a metalized surface facing the substrate 150 in this embodiment. Having the second diffuser 110 formed from a dielectric material with a metalized surface is beneficial in that the apertures formed through the second diffuser 110 have an inner surface made from dielectric material. When using the dielectric second diffuser 110 with a metalized bottom surface, the voltage applied to the bottom metalized surface facing the substrate 150 orients current and the electric field through the low ion density plasma within the process volume 170 to the substrate 150 or from the substrate 150 and through the low ion density plasma.

In yet another embodiment, the second diffuser 110 is formed from a silicon material, such as a crystalline silicon material, and the resistivity across the thickness of the second diffuser 110 is controlled by doping the surface facing the substrate.

In some embodiments, the second diffuser 110 includes a temperature control passage 121 disposed therethrough. The temperature control passage 121 circumscribes the portion of the second diffuser 110 that contains the gas flow apertures. The temperature control passage 121 may be utilized to either cool or heat the second diffuser 110. In embodiments wherein the second diffuser 110 is desired to be cooled, the temperature control passage 121 is a coolant passage and is configured to receive a cooled liquid, such as water. In embodiments wherein the second diffuser 110 is desired to be heated, the temperature control passage 121 is a heated passage and is configured to receive a heated gas or fluid. Alternatively, a heating coil may be disposed within the temperature control passage 121. The presence of the temperature control passage 121 is beneficial in embodiments wherein the second diffuser 110 has a larger thickness.

Figure 7:
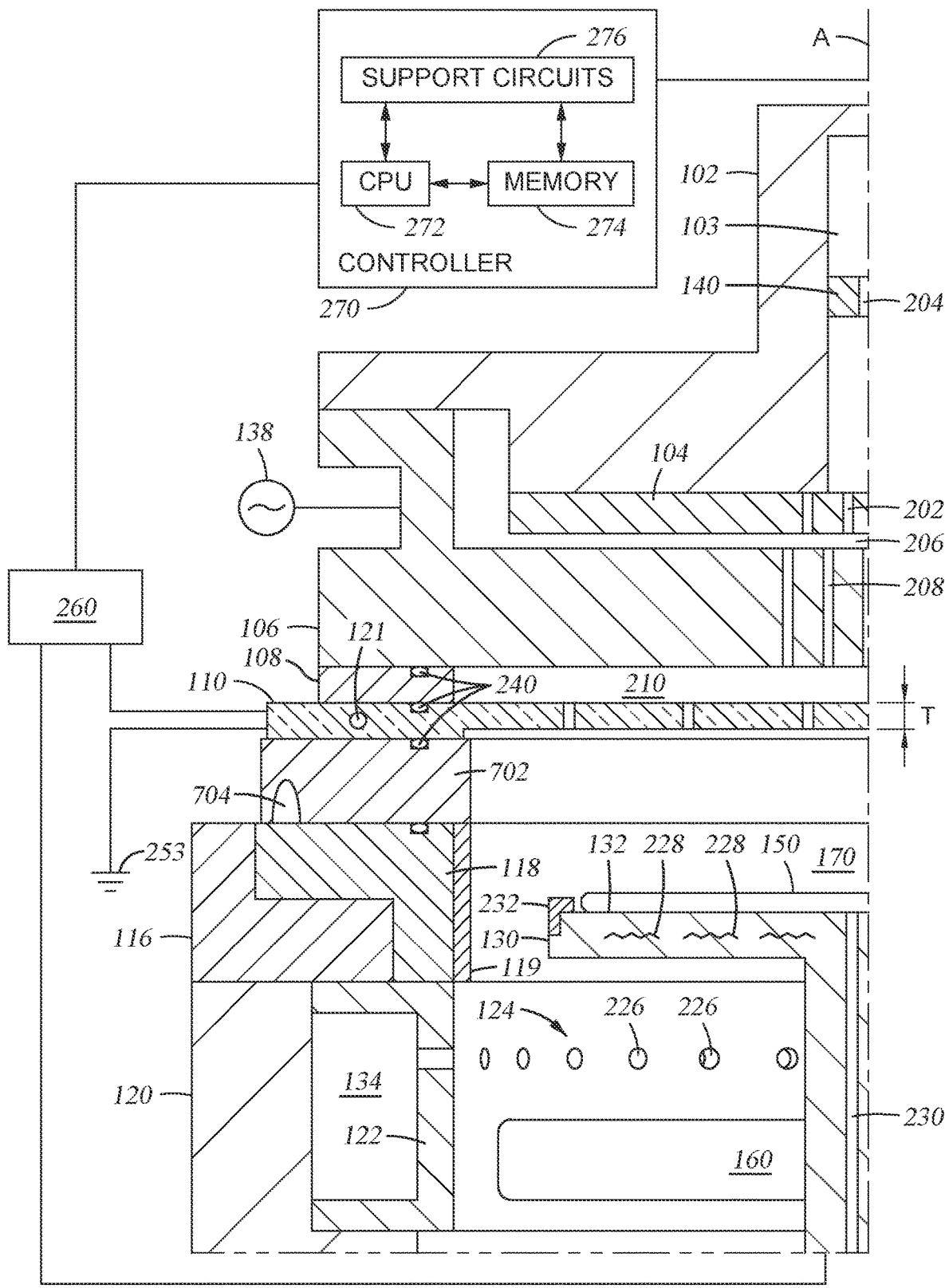
FIG. 7 illustrates a schematic cross-sectional view of a portion of the processing chamber of FIG. 1, according to another embodiment.

FIG. 7 illustrates a schematic cross-sectional view of a portion of the processing chamber of FIG. 1, according to another embodiment. The embodiment of FIG. 7 is similar to the embodiment of FIG. 6, but the second diffuser 110 is separated from the showerhead spacer 118 and the upper chamber body 116 by a second diffuser spacer 702. The second diffuser spacer 702 is disposed on top of the showerhead spacer 118. The second diffuser spacer 702 is configured to further separate the second diffuser 110 and the substrate support 130. The second diffuser spacer 702 is formed of a conductive material such as aluminum. The second diffuser spacer 702 is a ring and includes a central opening which forms part of the process volume 170.

The second diffuser spacer 702 further includes one or more heating elements 704 disposed therein. The one or more heating elements 704 circumscribes the process volume 170.

Figure 8:
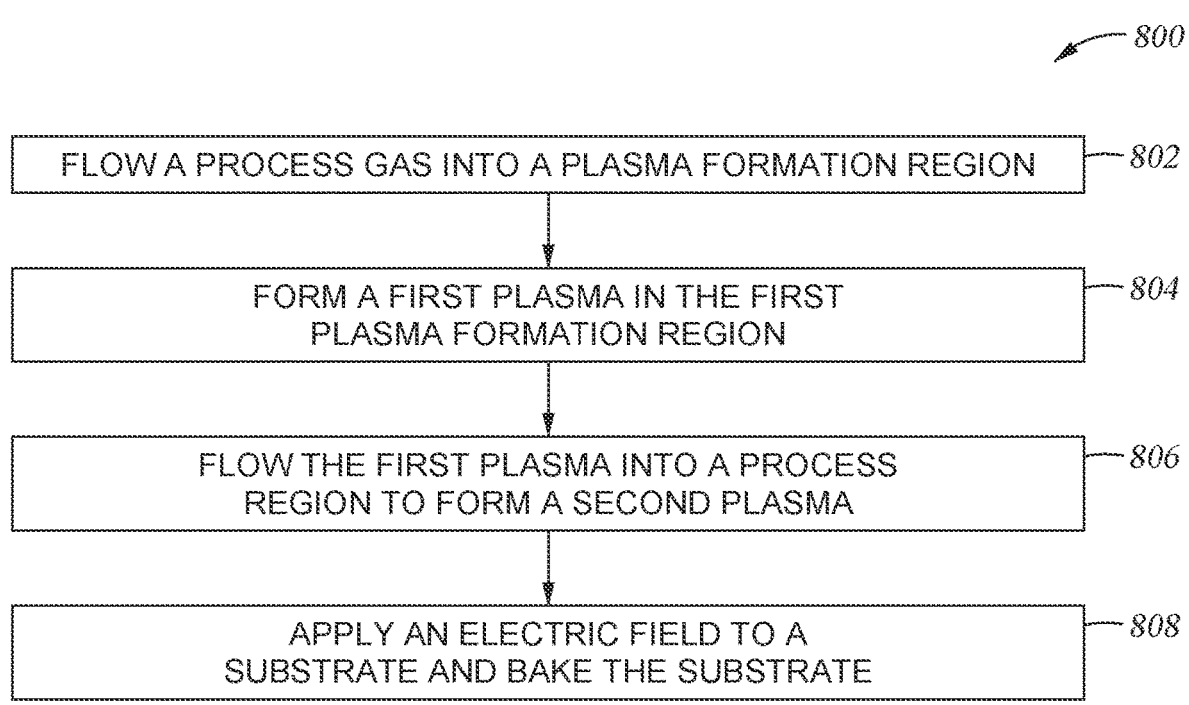
FIG. 8 is a flow diagram of a method of processing a substrate, according to one embodiment.

FIG. 8 is a flow diagram of a method 800 of processing a substrate within the process chambers of FIG. 7 and FIG. 8. The method 800 enables the formation of a field-guided post-exposure bake on a resist of a substrate, such as the substrate 150. The method 500 includes flowing a process gas into a plasma formation region, such as the first plasma generation region 210, during an operation 802. The process gas flowed into the plasma formation region is a mixture of inert gases, such as helium, neon, argon, krypton, and/or xenon. In some embodiments, the mixture of inert gases is one or a mixture of helium and argon. In embodiments described herein, the process gas flowed into the plasma formation region consists of only inert or other non-reactive gases, such that the process gas comprises only one or more inert gases. If other gases, such as deposition precursors, cleaning gases, or oxidation precursors are utilized the resist material disposed on the substrate may be damaged or contaminated.

After flowing the process gas into the plasma formation region, a first plasma is formed within the plasma formation region during another operation 804. The first plasma has a first ion density. The first ion density plasma is a high ion density plasma, such that the ion density within the first plasma is about $10^5$ ions/cm$^3$ to about $10^{10}$ ions/cm$^3$. Similarly, the first electron density is about $10^5$ electrons/cm$^3$ to about $10^{10}$ electrons/cm$^3$. Within the plasma formation region, an AC voltage applied between the face plate 106 and the second diffuser 110 by a source match device, such as the source match device 138, with a frequency of about 8 MHz to about 20 MHz, such as about 10 MHz to about 15 MHz. The first gas is held at a pressure of about 0.5 Torr to about 8 Torr, such as about 1 Torr to about 5 Torr. The power applied to the process gas while within the first plasma generation region is about 25 W to about 2000 W, such as about 50 W to about 1500 W. During the operation 504, a face plate, such as the face plate 106, is attached to a power source, such that the RF power is applied to the face plate while a second diffuser, such as the second diffuser 110, is electrically grounded and has a constant voltage potential.

After forming the first plasma, the first plasma is flowed into a process volume, such as the process volume 170, during an operation 806. The first plasma is flowed from the plasma formation region into the process volume through the second diffuser. The second diffuser forms as least a portion of the process volume, such that no additional diffusion plates or showerheads are disposed between the second diffuser and a substrate support, such as the substrate support 130. The second diffuser forming a portion of the process volume enables better coupling of an electric field between the substrate support and the second diffuser. Further, it has been found fewer diffusers and showerheads within the plate stack enable more controlled and increased ion concentrations within the process volume as compared to other embodiments, such as the embodiment of FIG. 2, which utilized additional diffusers and/or showerheads. Flowing the first plasma through the second diffuser forms a second plasma.

The second plasma is formed by flowing the first plasma through the second diffuser. The second plasma has an ion concentration less than the ion concentration of the first plasma as the second diffuser serves as an SMD to block the flow of at least some of the ions into the process volume. The voltage differential between the second diffuser and the substrate support is about 0V to about 300 V, such as about 10 V to about 250 V. The voltage source 260 may further include AC/DC waveform control, such that a DC voltage may be applied or an AC voltage with a frequency of less than or equal to about 7.5 kHz, such as an AC voltage of about 0 kHz to about 7.5 kHz. In some embodiments, the AC waveform may have a DC offset, such that the signal peaks are not centered about 0 V. The pressure within the process volume 170 is about 0.5 Torr to about 10 Torr, such as about 0.5 Torr to about 8 Torr, such as about 1 Torr to about 5 Torr.

The second plasma is a charged species cloud while within the process volume, such that the concentration of ions within the second plasma is reduced while passing through the second diffuser and into the process volume. The ions/electrons within the charged species cloud are controlled by the electric field formed between the second diffuser and the substrate support. The electric field assists in controlling the ion density and ion energy levels within the second plasma, such that the ion or electron density is about $10^4$ ions/cm$^3$ to about $10^6$ ions/cm$^3$. Similarly, the electron density within the second plasma is about $10^4$ electrons/cm$^3$ to about $10^6$ electrons/cm$^3$. The charged ions within the charges species cloud have an ion temperature of less than about 1 eV each and therefore have reduced impact on the photoresist disposed on the substrate. The low power third plasma/charged species cloud may be referred to herein as a dark plasma. The dark plasma is beneficial in that the photoresist does not undergo a concurrent exposure process during the post exposure bake operation which utilizes the dark plasma. Either concurrently with or immediately after the second plasma is flowed into the process volume to form the charged species cloud, the substrate on a substrate support surface is baked at a temperature of about 75° C. to about 300° C., such as about 100° C. to about 250° C. during another operation 808.

While the substrate is baked during the operation 808, an electric field is applied between the substrate support and the second diffuser and through the second plasma. The second plasma serves to couple the electric field and enables improved control of the electric field strength and subsequent resist bake operations on the substrate. The substrate as described herein includes a resist layer, such as a photoresist layer disposed thereon. The application of the heating and the electric field to the substrate is performed after the resist layer has been patterned during an exposure operation. The heating and electric field application bake the resist layer and drive charged particles within the resist layer in pre-determined directions to reduce the diffusion of the charged particles in undesired directions.

The generated electric field is coupled to the substrate through the charged species cloud. The charged species cloud additionally conducts a small amount of current (about 0.005 mA to about 0.1 mA, such as about 0.005 mA to about 0.05 mA) between the substrate/substrate support surface and the second diffuser. The small amount of current has been found to improve bake results while not negatively impacting the photoresist.

Described herein are apparatus and methods for forming a low ion density plasma above a substrate within a process volume. The low ion density plasma assists in enabling a uniform electric field between an electrode, such as a showerhead or ion blocker plate described herein, and the substrate or substrate support. The low ion density plasma exhibits a sufficiently low enough ion density to reduce damage or defects to the substrate during field guided post-exposure bake operations, but high enough to enable good electric field distribution and coupling properties.

While the foregoing is directed to embodiments of the present disclosure, other and further embodiments of the disclosure may be devised without departing from the basic scope thereof, and the scope thereof is determined by the claims that follow.

What is claimed is:

1. An apparatus for substrate processing suitable for use in semiconductor manufacturing, comprising:
    a face plate;
    a source match device electrically coupled to the face plate;
    a diffuser disposed opposite the face plate, a plasma formation volume disposed between the face plate and a first side of the diffuser;
    an insulator disposed between the face plate and the diffuser;
    a process volume partially formed by a second side of the diffuser;

a substrate support disposed within the process volume opposite the diffuser and comprising one or more heating devices therein;

a voltage source in electrical communication with the diffuser and the substrate support and configured to generate an electric field oriented vertically between the diffuser and the substrate support; and a controller configured to cause the apparatus to perform operations of:
flow a process gas into the plasma formation volume;
form a first plasma with a first ion concentration;
flow the first plasma through the diffuser to form a second plasma with a second ion concentration of $10^4$ ions/cm$^3$ to $10^6$ ions/cm$^3$;
apply a voltage differential between the diffuser and the substrate support to form the electric field across the second plasma; and
heat a substrate with a resist layer disposed on the substrate support to a temperature of 75° C. to 300° C. while applying the electric field.

2. The apparatus of claim 1, wherein the process gas is an inert gas.

3. The apparatus of claim 1, wherein the first plasma comprises a first ion concentration of $10^5$ ions/cm$^3$ to $10^{10}$ ions/cm$^3$.

4. The apparatus of claim 1, further comprising a showerhead spacer configured to mechanically support the diffuser and an upper chamber liner disposed radially inward of the showerhead spacer and forming a portion of the process volume, the upper chamber liner formed from a ceramic material.

5. The apparatus of claim 1, wherein a central portion of the diffuser has a thickness of 5 mm to 40 mm.

6. The apparatus of claim 1, wherein the diffuser is electrically grounded.

7. A method for processing a substrate, comprising:
flowing a process gas into a plasma formation region;
forming a first plasma with a first ion density from the process gas in the plasma formation region;
flowing the first plasma through a diffuser and into a process region and forming a second plasma with a second ion density less than the first ion density;
applying an electric field across the second plasma within the process region between a substrate and the diffuser, the electric field driving charged particles of a resist layer disposed on the substrate in a first direction without exposing the resist layer; and
baking the resist layer formed on the substrate by heating the substrate using one or more heating devices within a substrate support while applying the electric field across the substrate.

8. The method of claim 7, wherein the process gas is an inert gas.

9. The method of claim 8, wherein the inert gas is one or a combination of helium and argon.

10. The method of claim 7, wherein the substrate is heated to a temperature of 75° C. to 300° C.

11. The method of claim 7, wherein the second plasma comprises a second ion concentration of $10^4$ ions/cm$^3$ to $10^6$ ions/cm$^3$.

12. The method of claim 11, wherein the first plasma comprises a first ion concentration of $10^5$ ions/cm$^3$ to $10^{10}$ ions/cm$^3$.

13. The method of claim 7, wherein a distance between the substrate support and the diffuser during the baking of the resist layer is 2 mm to 60 mm.

14. The method of claim 7, wherein a source match device is electrically coupled to a face plate and applies an RF power to the face plate during formation of the first plasma and a voltage source is in electrical communication with the diffuser and the substrate support and configured to generate the electric field between the diffuser and the substrate support.

15. A method for processing a substrate, comprising:
flowing an inert gas into a plasma formation region;
forming a first plasma with a first ion density from the inert gas in the plasma formation region;
flowing the first plasma through an ion blocker plate and into a process region to form a second plasma with a second ion density of $10^4$ ions/cm$^3$ to $10^6$ ions/cm$^3$;
applying an electric field across the second plasma within the process region between a substrate support and the ion blocker plate; and
baking a resist layer formed on a substrate disposed on the substrate support by heating the substrate using one or more heating devices while applying the electric field across the substrate.

16. The method of claim 15, wherein the inert gas is one or a combination of helium and argon.

17. The method of claim 15, wherein a distance between the substrate support and the ion blocker plate during the baking of the resist layer is 2 mm to 60 mm.

18. The method of claim 15, wherein the resist layer is an exposed resist layer.

19. The method of claim 15, wherein the second plasma conducts a current of 0.005 mA to 0.1 mA between the ion blocker plate and the substrate.

20. The method of claim 15, wherein the ions within the second plasma have an ion temperature of less than 1 eV.

* * * * *